United States Patent
Singh et al.

(10) Patent No.: US 10,636,870 B2
(45) Date of Patent: Apr. 28, 2020

(54) ISOLATION REGIONS FOR REDUCED JUNCTION LEAKAGE

(71) Applicant: Taiwan Semiconductor Manufacturing Co., Ltd., Hsinchu (TW)

(72) Inventors: Gulbagh Singh, Hsinchu (TW); Hsin-Chi Chen, Tainan (TW); Kun-Tsang Chuang, Miaoli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/998,405

(22) Filed: Aug. 15, 2018

(65) Prior Publication Data

US 2020/0058736 A1    Feb. 20, 2020

(51) Int. Cl.
| | |
|---|---|
| *H01L 29/06* | (2006.01) |
| *H01L 21/762* | (2006.01) |
| *H01L 21/8234* | (2006.01) |
| *H01L 21/306* | (2006.01) |
| *H01L 21/02* | (2006.01) |
| *H01L 21/768* | (2006.01) |

(52) U.S. Cl.
CPC .... *H01L 29/0649* (2013.01); *H01L 21/02565* (2013.01); *H01L 21/30608* (2013.01); *H01L 21/76224* (2013.01); *H01L 21/76831* (2013.01); *H01L 21/823481* (2013.01)

(58) Field of Classification Search
CPC .......... H01L 29/0649; H01L 21/76831; H01L 21/02565; H01L 21/823481; H01L 21/76224; H01L 21/30608
See application file for complete search history.

(56) References Cited

U.S. PATENT DOCUMENTS

| | | | |
|---|---|---|---|
| 2008/0179689 A1* | 7/2008 | Lee | ................... H01L 21/28518 257/384 |
| 2014/0357039 A1* | 12/2014 | Liu | ..................... H01L 29/0649 438/296 |

* cited by examiner

*Primary Examiner* — Sonya D. McCall-Shepard
(74) *Attorney, Agent, or Firm* — Sterne, Kessler, Goldstein & Fox P.L.L.C.

(57) ABSTRACT

The present disclosure describes a fabrication method that prevents divots during the formation of isolation regions in integrated circuit fabrication. In some embodiments, the method of forming the isolation regions includes depositing a protective layer over a semiconductor layer; patterning the protective layer to expose areas of the semiconductor layer; depositing an oxide on the exposed areas the semiconductor layer and between portions of the patterned protective layer; etching a portion of the patterned protective layer to expose the semiconductor layer; etching the exposed semiconductor layer to form isolation openings in the semiconductor layer; and filling the isolation openings with a dielectric to form the isolation regions.

20 Claims, 13 Drawing Sheets

ISOLATION REGIONS FOR REDUCED JUNCTION LEAKAGE

BACKGROUND

Shallow trench isolation (STI) regions are used in integrated circuit (IC) as a means for electrical isolation between adjacent semiconductor device components, such as field effect transistors (FETs).

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

The term "dielectric layer" or "dielectric material", as used herein, refers to a layer or a material that functions as an electrical insulator (e.g., a liner).

In integrated circuits (IC), semiconductor active regions are electrically isolated from each other by isolation structures, or regions, filled with a dielectric material—such as silicon oxide ($SiO_2$). Semiconductor active regions can be defined as doped silicon regions (e.g., n-type or p-type) on which field effect transistors can be formed. The isolation regions can be referred to as "shallow trench isolation (STI) regions." The formation of the STI regions involves several fabrication operations, which may include one or more wet etching steps. For example, one or more wet etching operations can be used to recess the $SiO_2$ in the STI regions to a desired depth. Wet etching however, being isotropic by nature, can create "divots" between the STI region and an abutting semiconductor active region. For example, divots can be described as recessed areas in the STI regions, formed between the sidewalls of the STI region and the abutting semiconductor active region.

Presence of divots in the STI region can result in a non-uniform silicide formation on the semiconductor active regions. For example, the resulting silicide can be thicker in the vicinity of the divot (e.g., at the edges of the semiconductor active region) and thinner towards the center of the semiconductor active region. Further, field effect transistors (e.g., n-type and p-type field effect transistors) can be impacted by the silicide non-uniformity, which can result in silicide resistance variations and source/drain leakage current (also referred to herein as "junction leakage"). Therefore, silicide non-uniformity can be detrimental to transistor performance, resulting in elevated levels of junction leakage, contact resistance variation, and power consumption.

The embodiments described herein are directed to a method that forms a protective layer between an STI region and an abutting semiconductor active region to suppress the formation of divots. More specifically, the protective layer can be disposed (e.g., directly) on the semiconductor active region and adjacent to a neighboring STI region. In some embodiments, the protective layer exhibits a lower etch rate than $SiO_2$ when both materials are exposed to a wet etch chemistry designed to etch the dielectric material in the STI regions. For example, an etch rate ratio between $SiO_2$ and the protective layer can be larger than 50. In some embodiments, the protective layer can include an oxide, an oxy-nitride, a carbide, or a metal oxide material. In some embodiments, the protective layer suppresses the formation of divots in STI regions and can result in a substantially uniform silicide formation across the semiconductor active region.

Figure 1:
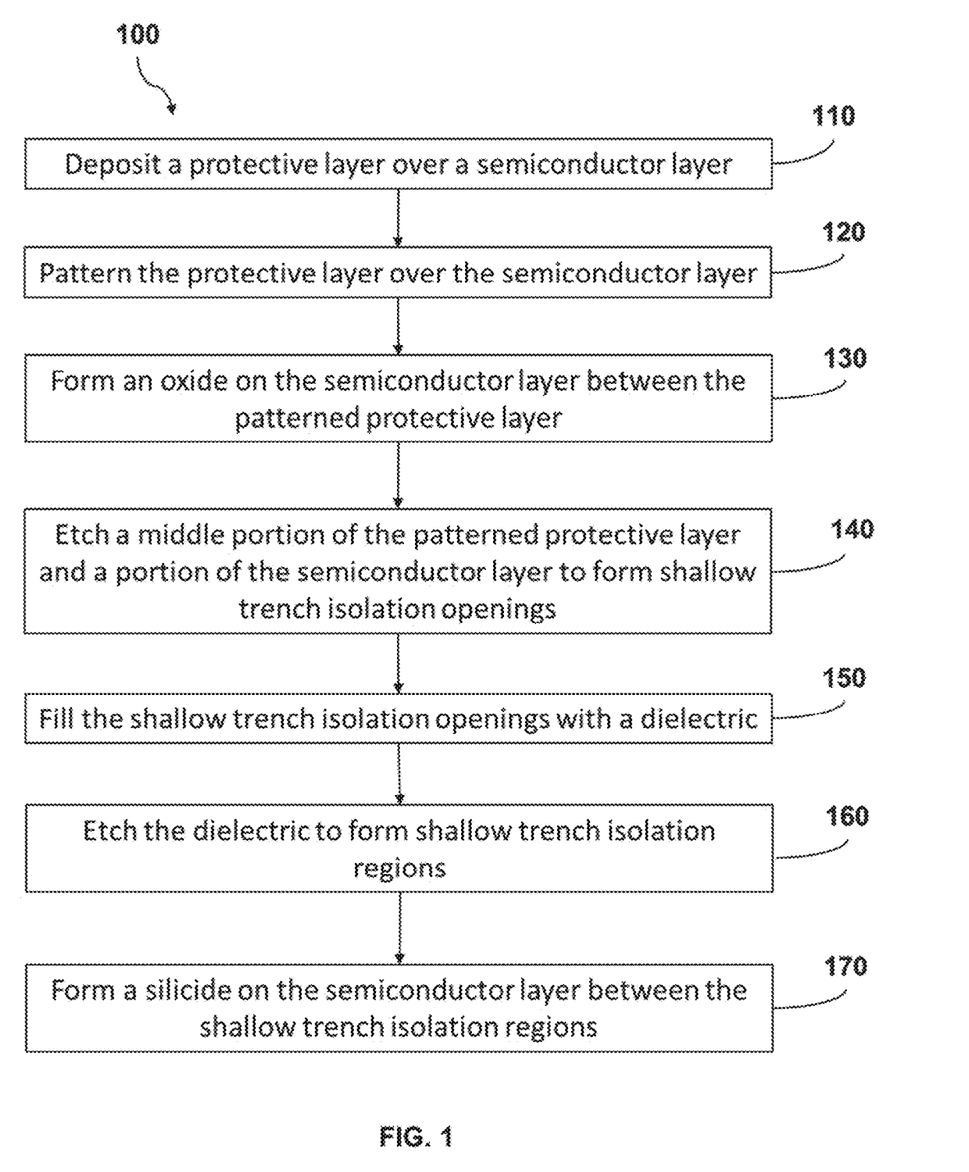
FIG. 1 is a flow diagram of a fabrication method that describes the formation of divot-free shallow trench isolation regions, in accordance with some embodiments.

FIG. 1 is a flow chart of fabrication method 100, according to some embodiments. Fabrication method 100 describes the formation of a protective layer between the STI structures and the abutting semiconductor active regions. The protective layer can prevent the formation of divots on the STI structures during one or more wet etching operations. Other, or additional, fabrication operations may be performed between the various operations of fabrication method 100. These fabrication operations are omitted merely for clarity. FIGS. 2-13 are used to describe the various operations of fabrication method 100.

Figure 2:
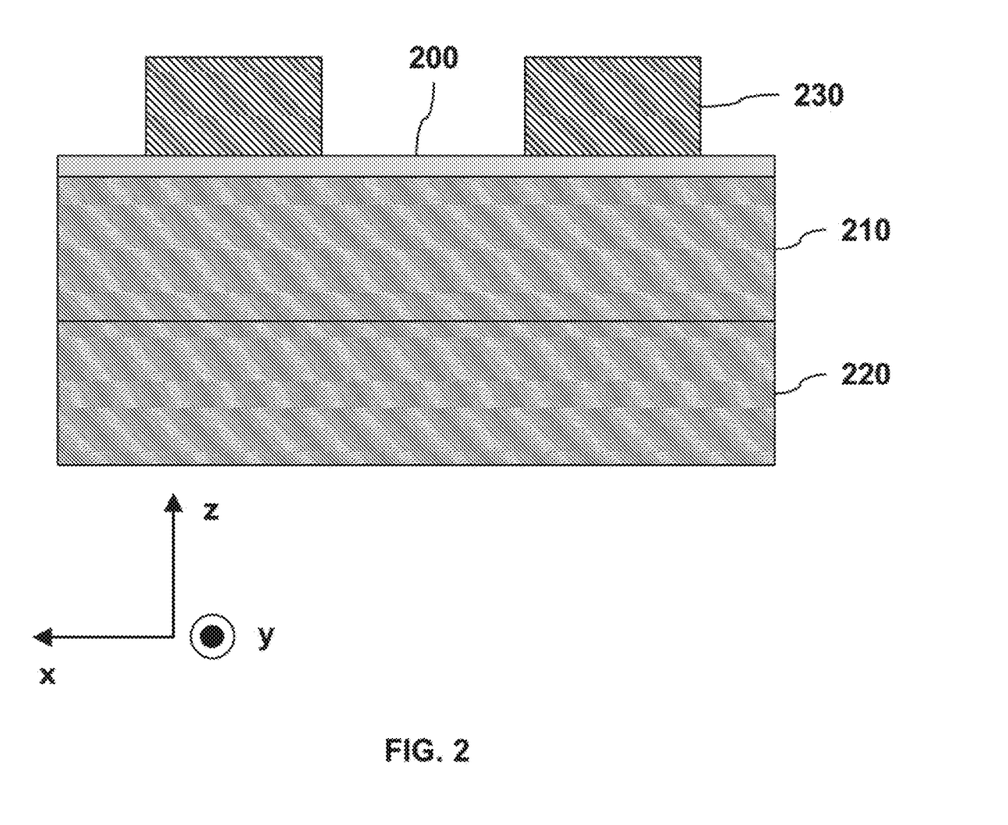
FIG. 2 is a cross-sectional view of a semiconductor layer over a substrate after the deposition of a protective layer, in accordance with some embodiments.

Fabrication method 100 begins with operation 110 and the deposition of a protective layer 200 over a semiconductor layer 210, as shown in FIG. 2. In some embodiments, protective layer 200 is "blanket" deposited over semiconductor layer 210 at a thickness between about 5 nm and about 25 nm (e.g., 5 nm, 10 nm, 15 nm, 20 nm, 25 nm, etc.). According to some embodiments, protective layer 200 includes an oxy-nitride, a nitride, a carbide, or a metal oxide material. By way of example and not limitation, protective layer 200 can include silicon oxy-nitride (SiON), silicon nitride ($Si_3N_4$ or $Si_xN_y$, thereafter "SiN"), silicon carbide (SiC), hafnium oxide ($HfO_2$), zirconium oxide ($ZrO_2$), titanium oxide ($TiO_2$), or combinations thereof. Protective layer 200 can be deposited, for example, by chemical vapor deposition (CVD), plasma-enhanced chemical vapor deposition (PECVD), physical vapor deposition (PVD), atomic layer deposition (ALD), plasma-enhanced atomic layer deposition (PEALD), or any other suitable deposition method.

According to some embodiments, protective layer 200 can be formed as a two-step process. For example, protective layer 200 can be formed by first depositing a Si, a SiN layer, a Hf layer, a Zr layer, or a Ti layer on semiconductor layer 210 and further converting the deposited layer to a nitride, an oxy-nitride, an oxide, or a carbide with an annealing process, a plasma process, a chemical treatment process, or combinations thereof. In an example, a Si layer can be oxidized to silicon oxide by a wet thermal oxidation process, and subsequently converted to silicon oxy-nitride with either a plasma process that uses ammonia ($NH_3$) plasma or with a nitrogen implant process. In another example, a SiN layer can be formed from a Si layer when the Si layer is exposed to ($NH_3$) plasma. A SiON layer can be formed from a SiN layer when the SiN layer is exposed to an oxygen plasma, or when the SiN layer is annealed in an oxygen or nitrous oxide ($NO_2$) ambient. Using a similar methodology, an Hf layer, a Zr layer or a Ti layer can be converted to $HfO_2$, $ZrO_2$, and $TiO_2$, respectively. The aforementioned annealing and plasma processes are exemplary and are not limiting. Therefore, alternative processes that can produce nitride, oxy-nitride, oxide, or carbide layers from Si, SiN, Hf, Zr, and Ti layers.

In some embodiments, a wet etch chemistry designed to etch $SiO_2$ in STI regions exhibits a lower etch rate for protective layer 200 compared to $SiO_2$. In other words, an etch rate ratio (e.g., selectivity) between $SiO_2$ and protective layer 200 for an etch chemistry designed to etch $SiO_2$ can be greater than 50 (e.g., 50, 70, 80, 100, etc.) depending on the type of protective layer 200. This means that, during a wet etching process, the wet etch chemistry removes $SiO_2$ at a higher rate than protective layer 200. Consequently, the material selection and thickness of protective layer 200 can be based on the resulting selectivity of the wet etching chemistry between $SiO_2$ and protective layer 200. For example, if the selectivity ratio between $SiO_2$ and protective layer 200 is low (e.g., at 50), protective layer 200 can be grown thicker to compensate for the material loss during the wet etching process. On the other hand, if the selectivity ratio between $SiO_2$ and protective layer 200 is high (e.g., at 100), protective layer 200 can be grown thinner since the material loss during the wet etching process is less.

In some embodiments, semiconductor layer 210 can include (i) silicon, (ii) a compound semiconductor such as gallium arsenide (GaAs), gallium phosphide (GaP), indium phosphide (InP), indium arsenide (InAs), and/or indium antimonide (InSb), silicon germanium (SiGe), (iii) an alloy, semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof.

For example purposes, semiconductor layer 210 in fabrication method 100 will be described in the context of a silicon (Si) layer. Based on the disclosure herein, other materials, as discussed above, can be used. These other materials are within the spirit and scope of this disclosure.

According to some embodiments, semiconductor layer 210 is disposed on layer 220. Layer 220 can be a substrate (e.g., a semiconductor bulk wafer, such as a silicon wafer) or a dielectric ($SiO_2$ or quartz) disposed over a semiconductor wafer (not shown in FIG. 2). For example, in the latter case, semiconductor layer 210 can be the Si layer of a silicon-on-insulator (SOI) wafer with layer 220 as the buried oxide layer (e.g., the insulator) disposed over a Si wafer (not shown in FIG. 2).

For example purposes, layer 220 in fabrication method 100 will be described in the context of a Si bulk wafer. Based on the disclosure herein, other materials, as discussed above, can be used. These other materials are within the spirit and scope of this disclosure.

Figure 3:
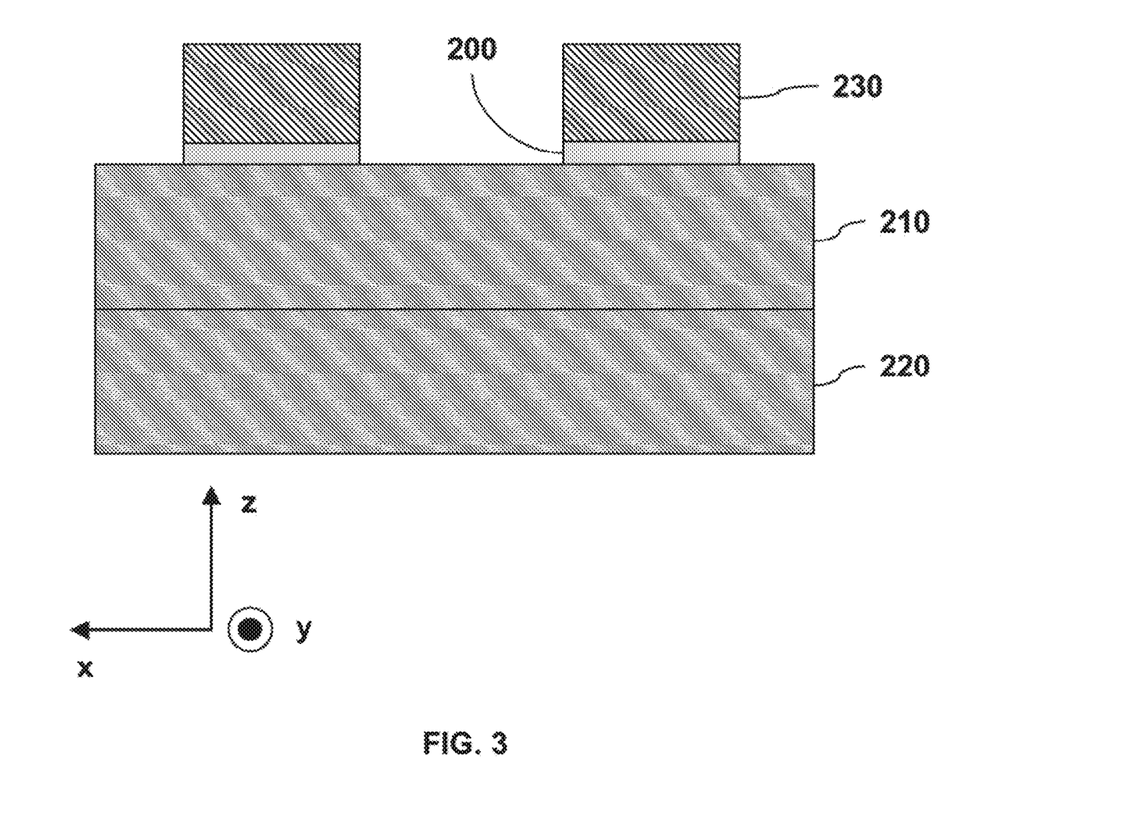
FIG. 3 is a cross-sectional view of a patterned protective layer over a semiconductor layer, in accordance with some embodiments.

In referring to FIG. 1, in operation 120 of fabrication method 100, protective layer 200 can be patterned over semiconductor layer 210. Patterning of protective layer 200 can be accomplished by a combination of photolithography and etch operations. For example, a photoresist layer can be deposited over protective layer 200 and subsequently patterned to form photoresist structures 230. Using photoresist structures 230 as an etch mask, a subsequent etching process (e.g., a dry etching process) can remove the exposed portions of protective layer 200 over semiconductor layer 210, as shown in FIG. 3. According to some embodiments, the dry etching process is selective towards protective layer 200. In other words, the dry etching process can exhibit a higher etch rate for protective layer 200 as compared to Si (e.g., semiconductor layer 210). Therefore, the dry etching process can be terminated (e.g., end-pointed) when semiconductor layer 210 is exposed. In some embodiments, instead of a patterned photoresist layer (e.g., photoresist structures 230), a hard mask layer can be deposited and patterned to form hard mask structures similar to photoresist structures 230. In this case, a wet etching process with diluted hydrofluoric acid (DHF)—e.g., in place of a dry etching process—can be used to remove the exposed protective layer 200 over semiconductor layer 210.

In some embodiments, the photoresist layer can be a negative tone photoresist. With the negative tone photoresist, the exposed areas of the photoresist to the ultraviolet (UV), deep ultraviolet (DIN), or extreme ultraviolet (EUV) light are not removed in a subsequent photoresist development operation. However, this is not limiting and a positive tone photoresist can also be used to pattern protective layer 200. Once protective layer 200 is patterned, photoresist structures 230 can be removed (e.g., stripped) with a wet etching process.

Figure 4:
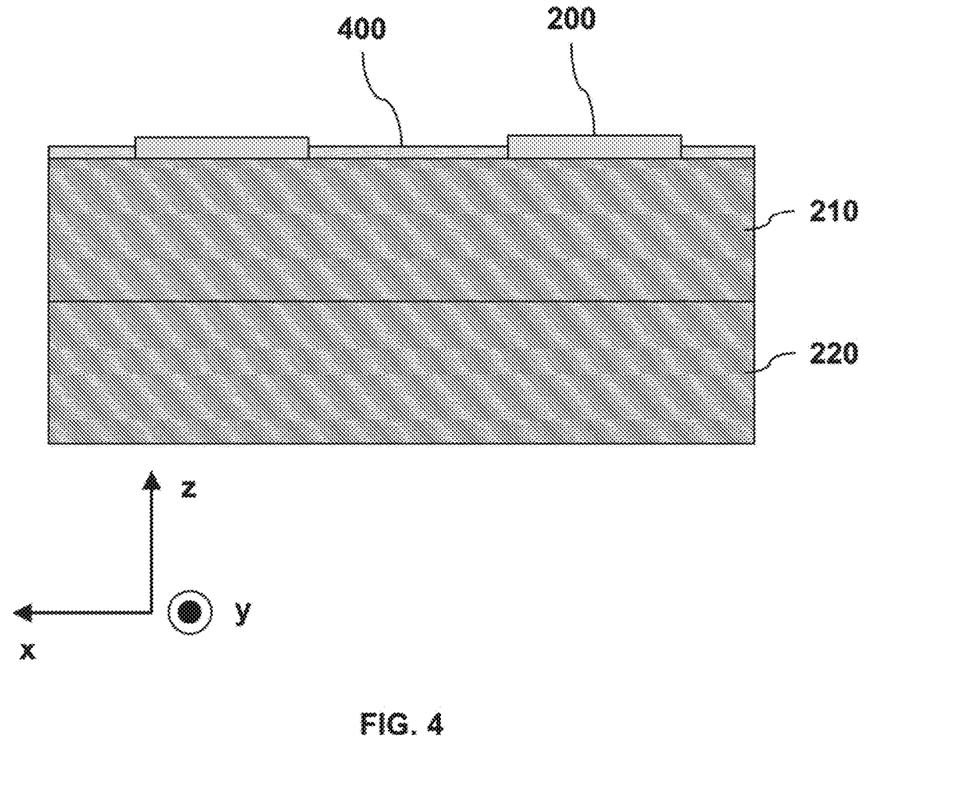
FIG. 4 is a cross-sectional view of a patterned protective layer over a semiconductor layer after the formation of an oxide, in accordance with some embodiments.

In referring to FIG. 1, in operation 130 of fabrication method 100, an oxide 400 is formed on semiconductor layer 210 and between the patterned protective layer 200. Oxide 400 is shown in FIG. 4. By way of example and not limitation, oxide 400 can be a thermally grown $SiO_2$ layer. Since oxide 400 does not form on protective layer 200, protective layer 200 can be used as a deposition mask during the growth of oxide 400. As a result, oxide 400 can be selectively formed on exposed areas of semiconductor layer 210.

Figure 5:
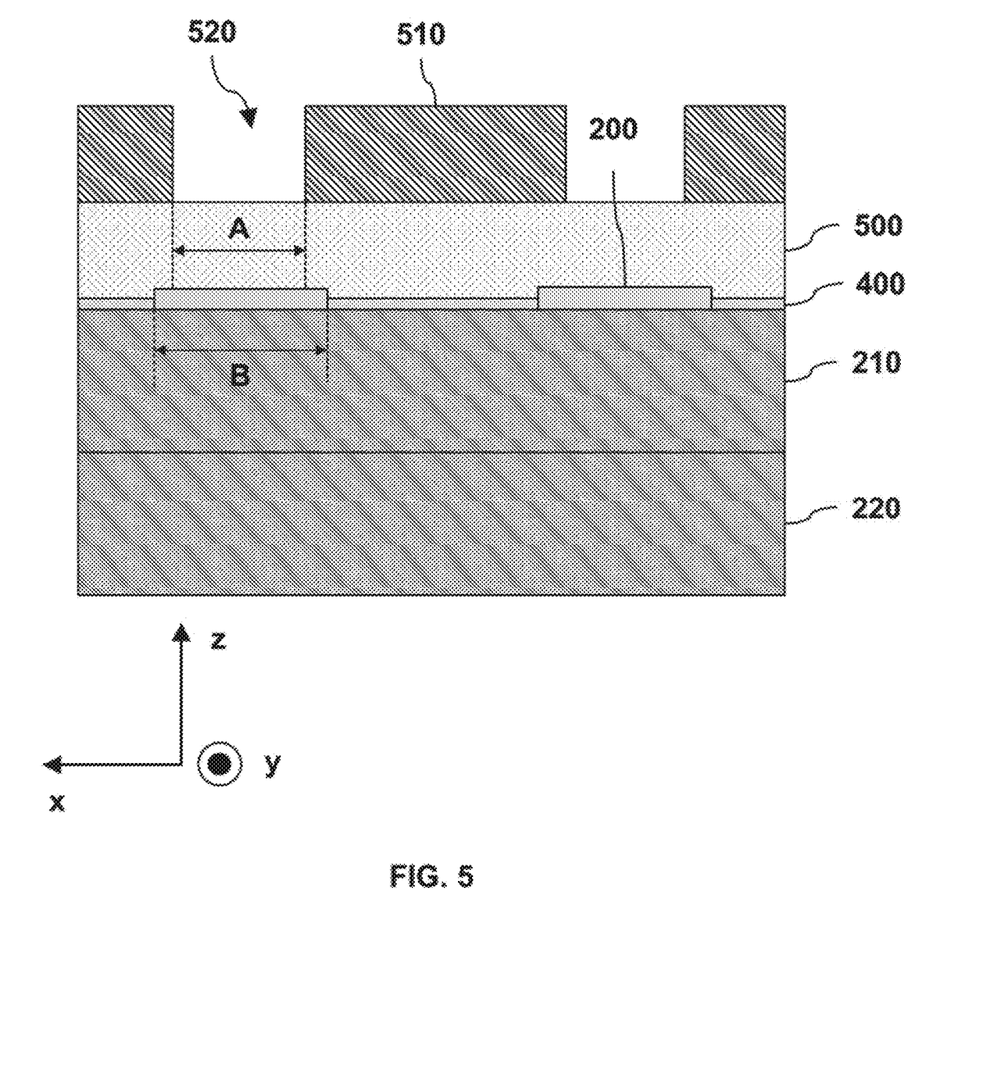
FIG. 5 is a cross-sectional view of a patterned protective layer over a semiconductor layer after the deposition of a nitride layer and a patterning process of a photoresist layer, in accordance with some embodiments.

Referring to FIG. 5, a nitride layer 500 can be blanket deposited over protective layer 200 and oxide 400. Nitride layer 500 can be polished with a chemical mechanical polishing (CMP) process so that its top surface is substantially planar. In some embodiments, nitride layer 500 is a SiN capping layer that acts as a hard mask in subsequent operations. A photoresist layer 510 can be deposited over nitride layer 500 and patterned so that openings 520 can be formed vertically through photoresist layer 510. According to some embodiments, openings 520 expose respective areas of underlying nitride layer 500. In some embodiments, each opening 520 is substantially aligned to patterned protective layer 200 on semiconductor layer 210. Further, the width A of each opening 520 is smaller than the width B of the underlying patterned protection layer 200. In some embodiments, with the width A smaller than the width B, the edge portions of the patterned protective layers 200 are not removed during the etching process of later-formed STI openings.

Figure 6:
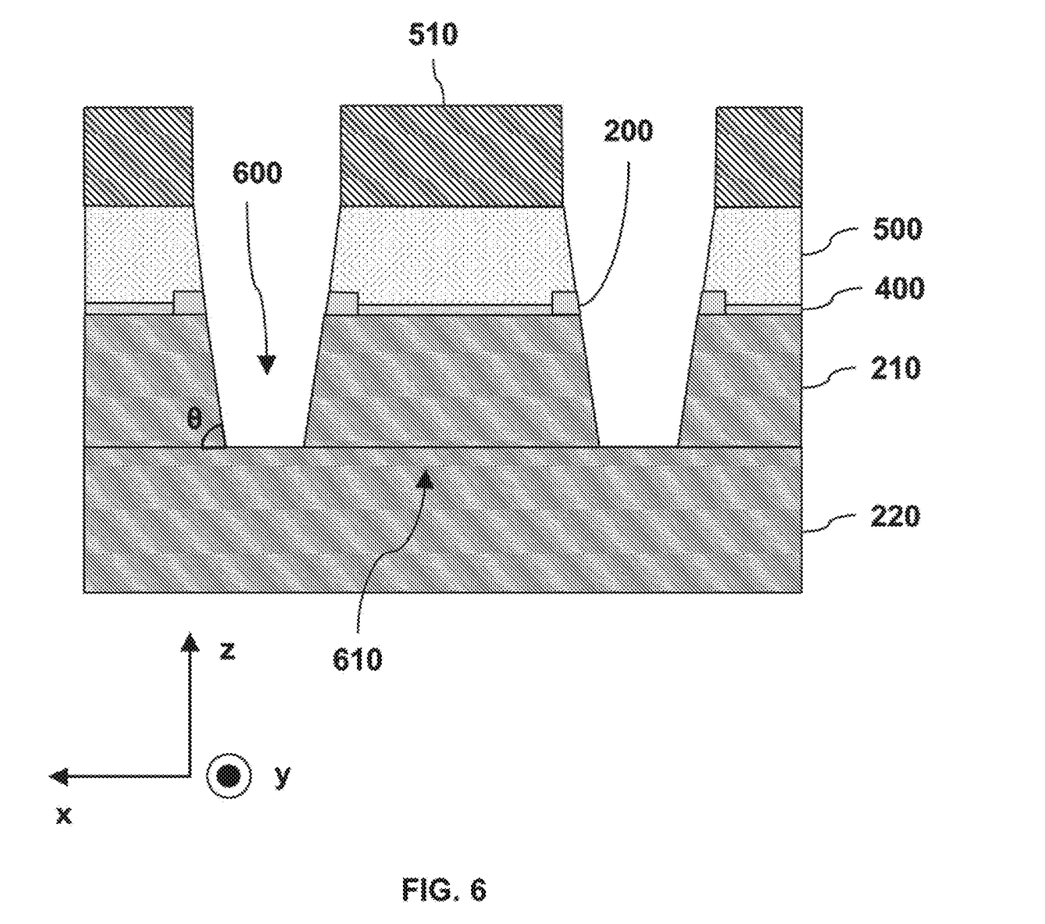
FIG. 6 is a cross-sectional view of a patterned protective layer over a semiconductor layer after the formation of shallow trench isolation openings in the semiconductor layer, in accordance with some embodiments.

In referring to FIG. 1, in operation 140, [state operation]. In referring to FIG. 6, using the patterned photoresist layer 510 as an etch mask, a dry etching process can remove nitride layer 500, a middle portion of protective layer 200, and semiconductor layer 210 to form STI openings 600, according to operation 140 of fabrication method 100. As a result, STI openings 600 are formed in semiconductor layer 210 and divide semiconductor layer 210 into semiconductor structures 610. In some embodiments, patterned photoresist layer 510 can be used to control the dimensions of STI openings 600 and the dimensions of semiconductor structures 610. For example, the width and the pitch of the patterned photoresist layer 510 can be used to control the width and the pitch of the resulting STI openings 600. According to some embodiments, as a result of the etching process, the sidewalls of nitride layer 500 can be recessed with respect to the edges of the etched protective layer 200. Further, in some embodiments, the sidewalk of the resulting STI openings 600 can have a positive slope (e.g., an angle θ smaller or equal to 90°, θ≤90°), as shown in FIG. 6. However this is not limiting and STI openings 600 can be etched to have substantially vertical sidewalls (e.g., with θ between about 86° and about 90°, 86°≤θ≤90°) or sidewalls with a negative slope (e.g., with θ greater than 90°, θ>90°). The sidewall slope (or sidewall angle θ) of STI openings 600 can be tuned, for example, by the dry etching process conditions. Therefore, the dry etching process conditions may be adjusted to achieve the desired slope (e.g., desired θ angle) for the sidewalls of STI openings 600 and the desired sidewall angle for semiconductor structures 610. In some embodiments, the dry etching process can include several sub-steps with a different etching chemistry for each sub-step.

As shown in FIG. 6, after operation 140 and the formation of STI openings 600, un-etched portions of protective layer 200 remain in place at the upper corners of STI openings 600. Further, STI openings 600 now expose underlying areas of layer 220.

In some embodiments, semiconductor structures 610 are active silicon regions that can be doped with n-type dopants or p-type dopants to form source/drain regions, where silicide layers can be formed thereon. Further, field effect transistors can be formed over semiconductor structures 610. In some embodiments, semiconductor structures 610, as depicted in FIG. 6, can be silicon fins with their length in the x-direction direction and their width in a x-direction.

Figure 7:
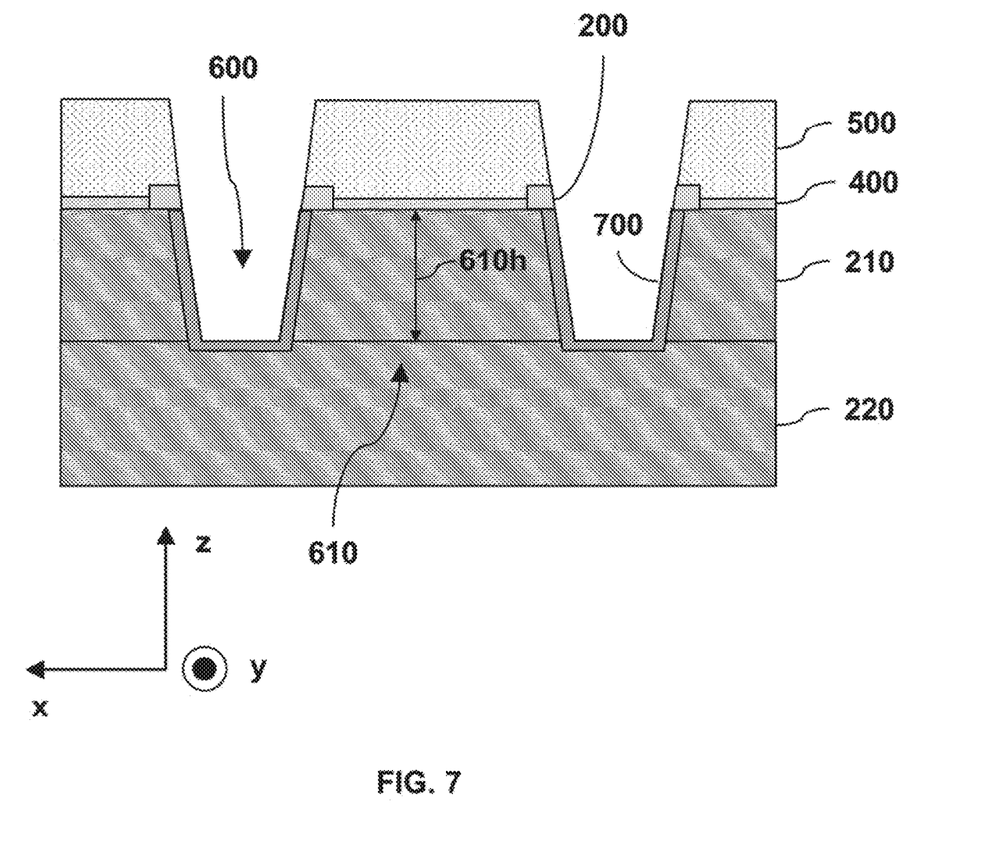
FIG. 7 is a cross-sectional view of oxide liners on the sidewalk of semiconductor structures, in accordance with some embodiments.

After semiconductor structures 610 and STI openings 600 are formed, the patterned photoresist layer 510 is removed with a wet cleaning process (e.g., wet strip), as shown in FIG. 7. In some embodiments, height 610h of the formed semiconductor structures 610 can range from about 100 nm to about 200 nm (e.g., 100 nm to 150 nm, 120 to 160 nm, 130 nm to 200 nm, etc.). However, this is not limiting and other heights for the semiconductor structures 610 are possible.

In some embodiments, oxide liners 700 are formed on the exposed surfaces of semiconductor structures 610 and layer 220 (e.g., on the sidewalls and bottom surface of STI opening 600). By way of example and not limitation, oxide liners 700 can be formed by thermal oxidation of the exposed surfaces of semiconductor structures 610 and layer 220. By way of example and not limitation, thermal oxidation of the sidewall surfaces of semiconductor structures 610 and layer 220 can occur in an oxidizing ambient that can include water vapors or molecular oxygen (e.g., wet or dry oxidation). During the thermal oxidation process, oxide liner 700 can be formed by consuming the silicon from the sidewall surfaces of semiconductor structures 610 and layer 220. In other words, a portion of oxide liner 700 is grown inwards from the sidewall surface of semiconductor structure 610 and top surface of layer 220, In some embodiments, oxide liner 700 includes $SiO_2$. By way of example and not limitation, the oxidation process can be performed at a temperature between about 800° C. and about 1200° C. (e.g., between 900° C. and 1100° C.). The thickness of oxide liner 700 can range from about 5 nm to about 20 nm. Since the exposed silicon areas available for oxidation are the sidewall surfaces of semiconductor structures 610 and the top surface of layer 220, oxide liners 700 are "selectively" grown on (or be "self-aligned" to) the sidewall surfaces of semiconductor structures 610 and top surface of layer 220, as shown in FIG. 7. However, if layer 220 is a dielectric (e.g., $SiO_2$, $Al_2O_3$, etc.), oxide liners 700 will only be formed on the sidewalls of semiconductor structures 610, according to some embodiments.

Figure 8:
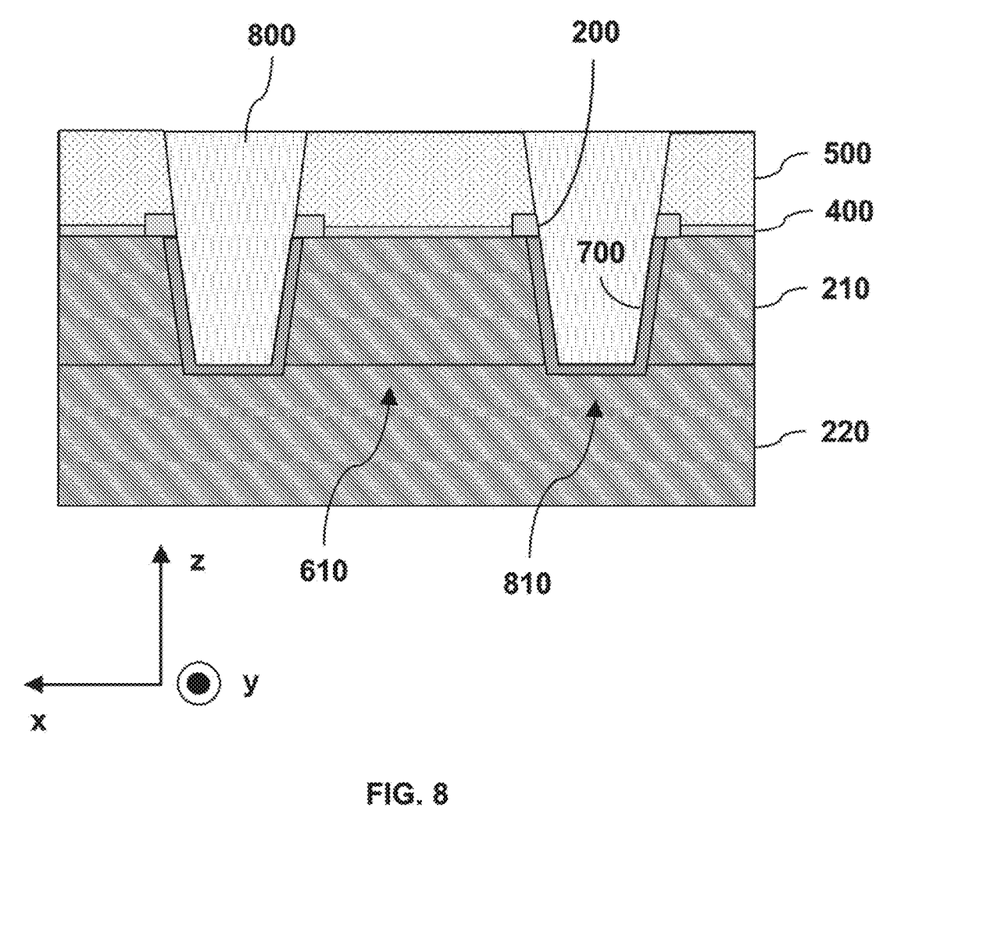
FIG. 8 is a cross-sectional view of shallow trench isolation regions with a patterned protective layer, filled with a dielectric, in a semiconductor layer, in accordance with some embodiments.

In referring to FIG. 1, fabrication method 100 continues with operation 150, where a dielectric 800 is deposited to fill STI openings 600 and to form STI regions 810, as shown in FIG. 8. In some embodiments, dielectric 800 is polished with a CMP process so that the top surface of dielectric 800 is substantially coplanar with the top surface of nitride layer 500. By way of example and not limitation, dielectric 800 can deposited with a high density plasma CVD (HDP-CVD) process or any other process that can fill the STI openings. For example, dielectric 800 can completely fill the space between semiconductor structures 610 without the formation of voids or "keyholes." In some embodiments, STI regions 810 can electrically isolate semiconductor structures 610.

After the formation of STI regions 810, nitride layer 500 can be selectively removed over oxide 400 and protective layer 200. In some embodiments, removal of nitride layer 500 can be achieved with a wet etching process (also referred to as a "wet chemical strip"). By way of example and not limitation, the wet etching process can include hot phosphoric acid ($H_3PO_4$) and can be performed at a temperature of about 160° C. Further, the wet etch chemistry can be selected to have high selectivity towards nitride layer 500 as opposed to oxide 400, dielectric 800, and protective layer 200. For example, the etch rate of nitride layer 500 ($ER_{500}$) can be greater than the etch rate for dielectric 800 ($ER_{800}$) and oxide 400 ($ER_{400}$), and the etch rate of dielectric 800 and oxide 400 can be greater than the etch rate for protective layer 200 ($ER_{200}$). In other words, $ER_{500} > ER_{800} = ER_{400} > ER_{200}$, when $ER_{800}$ is substantially equal to $ER_{400}$. In some embodiments, the etch rate ratio between nitride layer 500 and dielectric 800 (e.g., $ER_{500}/ER_{800}$) can range from about 50:1 to about 100:1, and the etch rate ratio between dielectric 800 and protective layer 200 (e.g., $ER_{800}/ER_{200}$) can range from about 2:1 to about 50:1. If selectivity is poor (e.g., below 50:1 between nitride layer 500 and dielectric 800/oxide 400, and below 2:1 between dielectric 800 and protective layer 200), portions of oxide 400, dielectric 800, and protective layer 200 will be etched concurrently with nitride layer 500 during the wet etching process.

Figure 9:
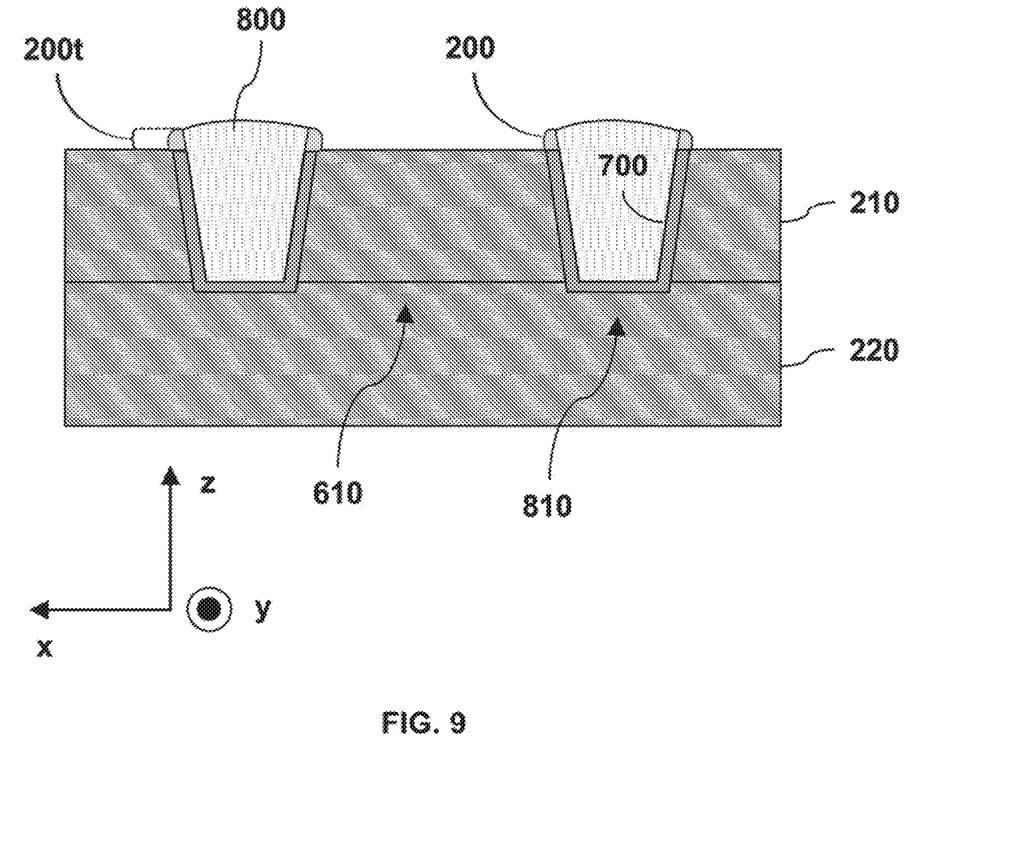
FIG. 9 is a cross-sectional view of divot-free shallow trench isolation regions in a semiconductor layer, in accordance with some embodiments.

In referring to FIG. 1 and operation 160, one or more wet etching processes can be used to recess dielectric 800, as shown in FIG. 9. In some embodiments, a combination of a dry and one or more wet etching processes are used to recess dielectric 800. By way of example and not limitation, a dry etching process can include a fluorocarbon-based chemistry (e.g., fluorinated hydrocarbons), such as tetrafluoromethane ($CF_4$), trifluoromethane ($CHF_3$), and the like. On the other hand, a wet etching process can include a diluted solution of hydrofluoric acid (HF) with a buffer, such as ammonium fluoride ($NH_4F$), diluted HF ($HF/H_2O$), $H_3PO_4$, sulfuric acid with deionized water ($H_2SO_4/H_2O$), or any combinations thereof. The aforementioned etch chemistries are exemplary and, therefore, not limiting. Other suitable dry etching and/or wet etching chemistries can be used. The one or more wet etching processes can be, for example, timed so that dielectric 800 inside STI regions 810 is not removed during the wet etching process. In some embodiments, oxide 400 is removed during the aforementioned wet etching process to expose the top surface of semiconductor layer 210.

In some embodiments, the wet etching process is designed to be selective towards dielectric 800. This means that protective layer 200 and semiconductor layer 210 will not be substantially etched during the wet etching process. For example, the selectivity of the wet etching process between dielectric 800 and protective layer 200 can range between about 2:1 and about 50:1, as discussed above. Therefore, after the end of the wet etching process, protective layer 200 remains at the upper corners of STI region 810 and covers the top surface of oxide liner 700, as shown in FIG. 9. In other words, oxide liner 700 is not exposed to the wet etching chemistry, according to some embodiments.

In some embodiments, the initial volume of protective layer 200 is reduced after the end of the wet etching process, as shown in FIG. 9. This means that protective layer 200 can be partially etched but not removed to the extent that the top surface of oxide liner 700 is exposed. In some embodiments, the remaining thickness 200t of protective layer 200, as shown in FIG. 9, can range from about 5 nm to about 2.5 nm. The overlay of protective layer 200 with the top surface of semiconductor structure 610 should be limited so that protective layer 200 can cover the top surface of oxide liner 700 without reducing the usable area of semiconductor structure 610, according to some embodiments.

In referring to FIG. 1, in operation 170, a silicide is formed on the semiconductor layer between the STI regions. For example, in FIG. 10, silicide 1000 can be formed over exposed surfaces of semiconductor layer 210. In some embodiments, silicide 1000 is a metal compound that can provide low electrical resistivity (e.g., 13-70 μΩ-cm) between a metal contact (not shown) and the doped silicon region of a transistor, e.g., semiconductor structure 610. By way of example and not limitation, silicide 1000 can include titanium silicide ($TiSi^2$), nickel platinum silicide (NiPtSi), cobalt silicide ($CoSi_2$), tungsten silicide ($WSi_2$), tantalum silicide ($TaSi_2$), molybdenum silicide ($MoSi_2$), or any other suitable silicide.

Figure 10:
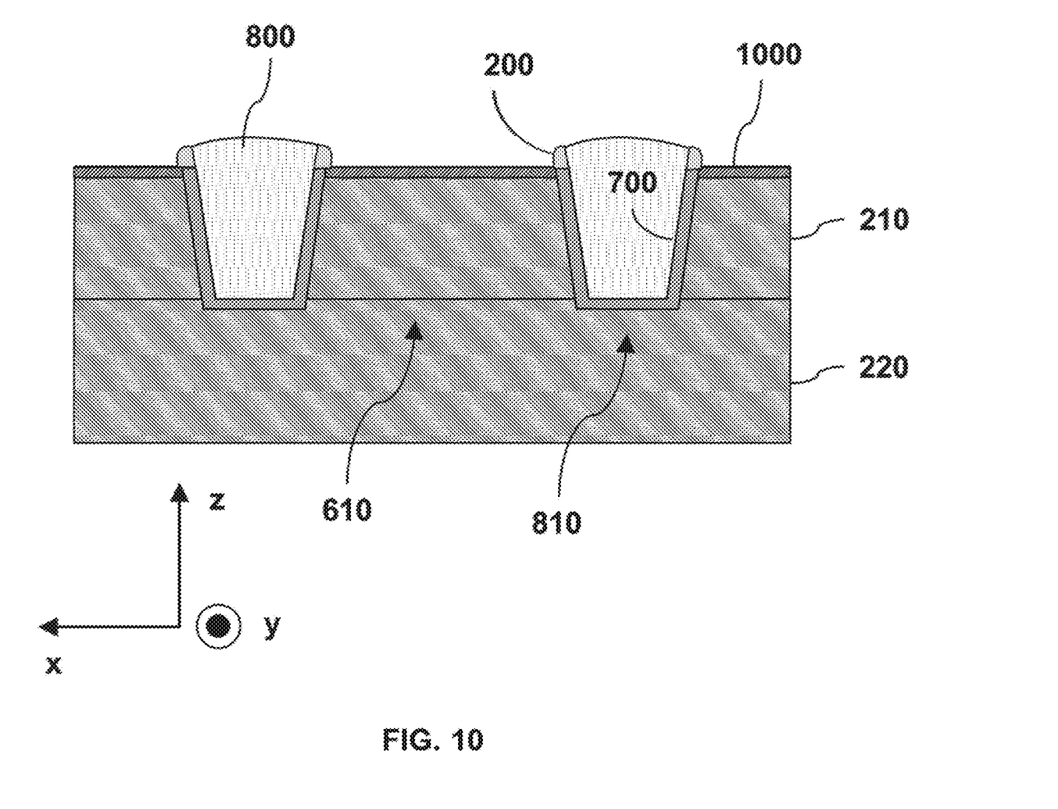
FIG. 10 is a cross-sectional view of divot-free shallow trench isolation regions in a semiconductor layer after the formation of a silicide, in accordance with some embodiments.

Silicide 1000 can be formed, for example, by depositing an appropriate metal (e.g., a refractory metal) such as titanium, nickel, cobalt, tungsten, tantalum, or molybdenum, on a silicon surface (e.g., semiconductor structure 610), and subsequently performing an anneal at, or above, the silicide formation temperature. The silicide formation temperatures can depend on the silicide material and may range from about 550° C. to about 1100° C. In areas where silicon is exposed, the metal can react with silicon to form silicide 1000. In other areas of the wafer, where no silicon is not exposed (e.g., where silicon is covered with an oxide, a nitride, or a metal, or over the STI regions), there is little or no reaction, and therefore, no silicide formation (e.g., no "silicidation"). After the silicide formation, the "unreacted" metal can be removed, if required, with a wet etching process. Additional metals, other than the ones mentioned above, may be used to form silicides with a stable, low-resistance phase (e.g., grain structure/microstructure). In addition, the annealing conditions annealing temperature, annealing time, and method of heating) can influence the silicide's thickness, composition and phase (grain structure/microstructure). Some silicides may require multiple annealing steps to achieve a low resistance phase.

Figure 11:
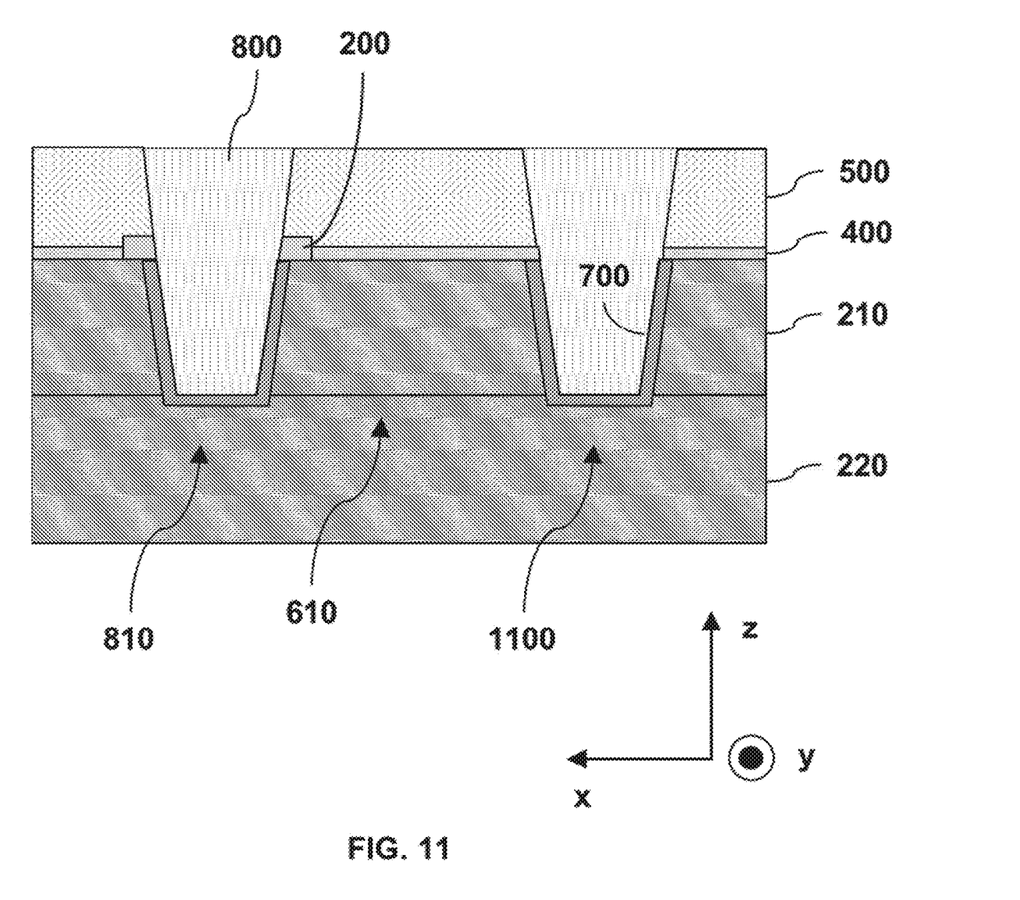
FIG. 11 is a cross-sectional view of shallow trench isolation regions with and without a patterned protective layer, filled with a dielectric, in a semiconductor layer, in accordance with some embodiments.
Figure 12:
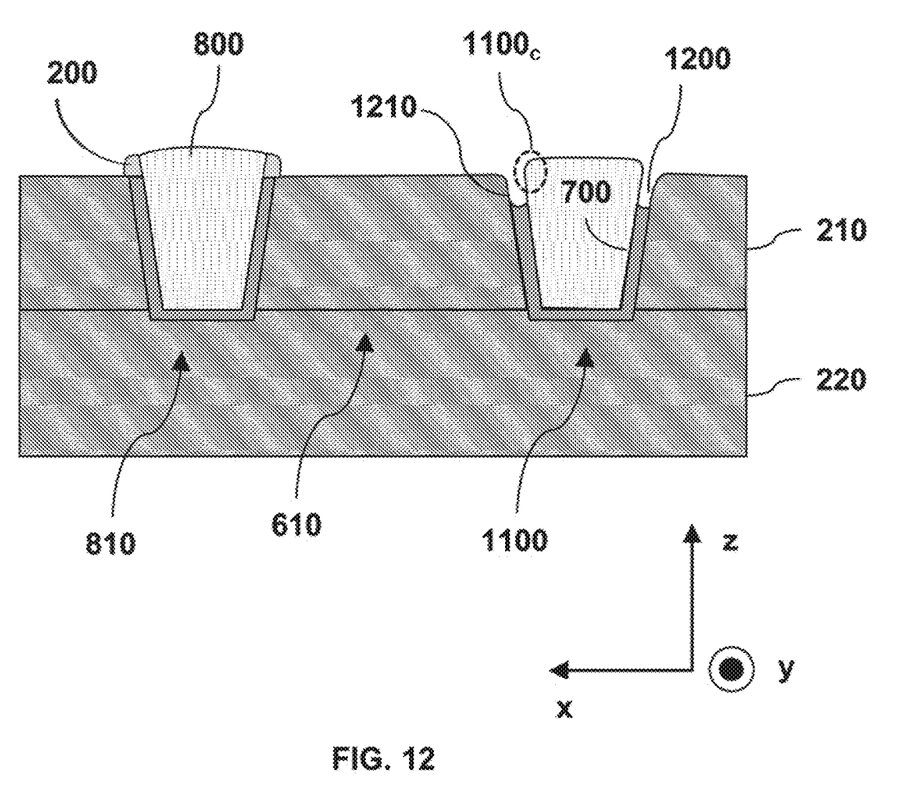
FIG. 12 is a cross-sectional view of a divot-free shallow trench isolation region and a shallow trench isolation region with divots in a semiconductor layer, in accordance with some embodiments.

According to some embodiments, FIG. 11 is a cross-sectional view of two different STI regions 810 and 1100 after operation 150 of fabrication method 100. In FIG. 11, protective layer 200 is formed on STI region 810 but not on STI region 1100. FIG. 12 is the resulting structure after operation 160 of fabrication method 100. Since STI region 1100 does not feature a protective layer 200 over oxide liner 700 (unlike STI region 810), STI region 1100 can develop divots 1200 during operation 160 if dielectric 800 and oxide liner 700 are etched at equal, or about equal, rates by the wet etching chemistry. Divots 1200 are formed because the wet etching chemistry used to etch portions of dielectric 800, according to operation 160, also etches (or partially etches) the exposed oxide liner 700. As a result, a portion of the upper sidewall surfaces 1210 of semiconductor structures 610, abutting STI region 1100, is exposed (e.g., not covered by oxide liner 700). Divots 1200 can have a depth between about 2 nm and about 10 nm. By way of example and not limitation, dielectric 800 can develop rounded corners $1100_c$ in STI region 1100 due to the absence of protective layer 200, as shown in FIG. 12.

According to some embodiments, STI regions 1100 and STI regions 810 are formed on the same substrate (e.g. wafer). This means that the resulting chip or integrated circuit can include STI regions with and without divots 1200, if desired. For example, it may be desired that critical transistors are protected from leakage with STI regions 810 that feature protective layer 200 are divot-free, Meanwhile, STI regions 1100 with divots can be used for less critical transistors in the circuit. In other words, fabrication method 1000 can be applied on selected STI regions of layer 220. For example, this can be achieved by the respective photolithography and etching processed described in operation 120 (e.g., depending on the pattern of photoresist 230 shown in FIG. 2).

Figure 13:
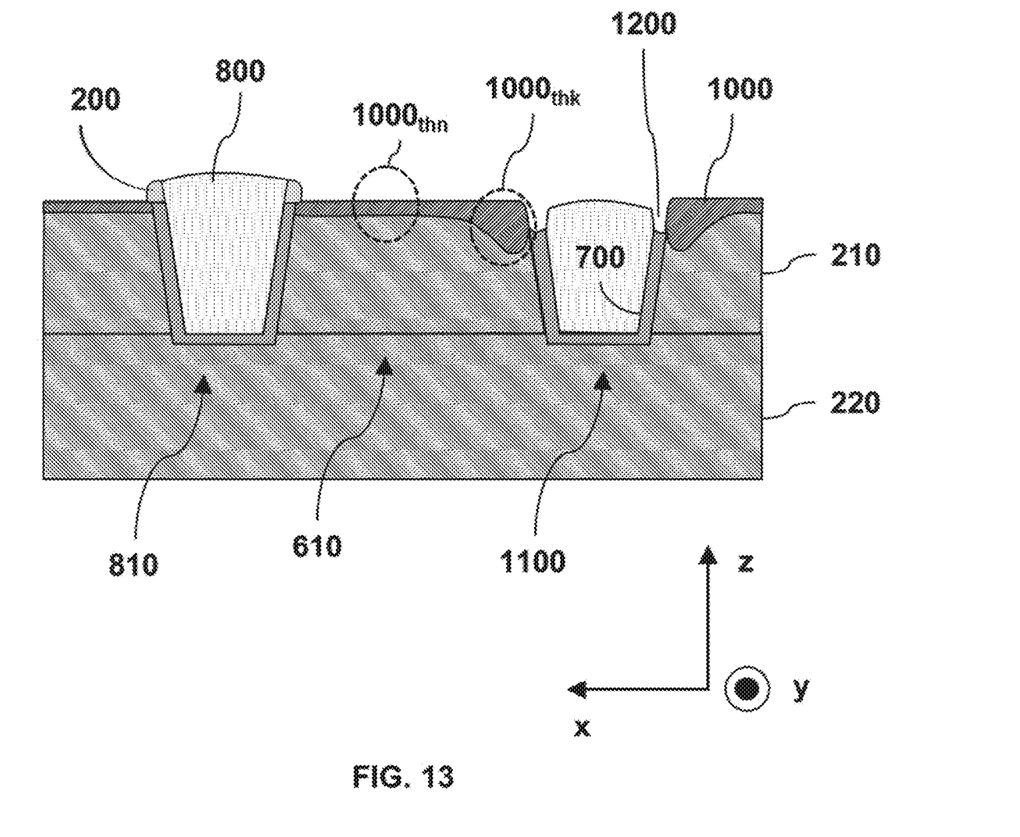
FIG. 13 is a cross-sectional view of a divot-free shallow trench isolation region and a shallow trench isolation region with divots in a semiconductor layer after the formation of a silicide, in accordance with some embodiments.

In referring to FIG. 13 and operation 170 of FIG. 1, silicide 1000 can be formed on semiconductor layer 210 of semiconductor structures 610 between a "divot-free" STI region 810 and STI region 1100 that features divots 1200. By way of example and not limitation, FIG. 13 shows the structure of FIG. 12 after a silicidation process—like the process described in operation 170 of FIG. 1. Silicide formation on semiconductor layer 210 between divot-free STI regions 810 produces a substantially uniform silicide 1000, as shown in FIG. 10. This is because the exposed surface of semiconductor structure 610 available for silicidation is limited to the top surface of semiconductor layer 210 at locations between divot-free STI regions 810.

In contrast, when divots are present in an STI region, as in STI region 1100, "additional" areas of semiconductor layer 210 can become available for silicidation. For example, these areas now available for silicidation include the upper sidewall surfaces 1210 of semiconductor structure 610, which are exposed by divots 1200 and are shown in FIG. 12. Therefore, during the silicide formation process, metal that is deposited on semiconductor layer 210 can fill divots 1200. For example, divots 1200 can be filled with titanium, nickel, cobalt, tungsten, tantalum, or molybdenum metal. In a subsequent annealing step, silicide 1000 can be formed on the upper sidewall surfaces 1210 of semiconductor structures 610 that are exposed by divots 1010 due to the reaction between the silicon in semiconductor layer 210 and the metal in divots 1200. Therefore, additional volume of metal can become available to react with additional surface areas of semiconductor structure 610 to produce additional silicide volume on the upper sidewall surface 1210 of semiconductor structure 610, as shown in FIG. 13. The result of this process is a non-uniform silicide across semiconductor structure 610, where a thicker silicide $1000_{thk}$ is formed in the vicinity of divots 1010 and thinner silicide $1000_{thn}$ is formed away from divots 1010, as shown in FIG. 13. The resulting silicide non-uniformity can cause undesirable contact resistance variation across semiconductor structures 610. Further, silicide formation deeper into semiconductor structure 610 (e.g., at locations of thicker silicide $1000_{thk}$) can increase junction leakage (e.g., source/drain leakage current) between the source/drain terminals and the channel or other doped regions (e.g., "wells") of the transistor.

The embodiments described herein are directed to a method that prevents the appearance of divots during the formation of STI regions in IC fabrication. In some embodiments, divot formation is prevented by disposing a protective layer over an oxide liner that is disposed between the dielectric material of the STI region and the semiconductor structure. The protective layer can prevent a wet etch chemistry used to recess the dielectric material of the STI region from etching the oxide liner and forming a divot in the STI region. In some embodiments, the wet etching chemistry used to recess the dielectric material etches silicon oxide faster than the protective layer. In some embodiments, the protective layer can include SiC, SiN, SiON, $HfO_2$, $TiO_2$, or $ZrO_2$. In some embodiments, the protective layer can include layers formed by the deposition of Si, SiN, Hf, Zr, or Ti layers followed by their conversion to oxide, nitride, carbide, or oxy-nitride. According to some embodiments, divot-free STI regions provide improved silicide thickness uniformity and mitigate junction leakage in the transistors. For example, junction leakage may increase when the silicide is formed in the divot area of the STI region and deeper into the semiconductor active region.

In some embodiments, a structure includes semiconductor structures formed over a substrate; and an isolation structure disposed between the semiconductor structures. The isolation structure further includes a first material in a middle portion of a top surface of the isolation structure; a second material at each edge portion of the top surface, where the second material is different from the first material; and a third material, different from the second material, that is disposed between the first material, the second material, and the semiconductor structures.

In some embodiments, a semiconductor structure includes semiconductor structures over a substrate an isolation region between adjacent semiconductor structures. The isolation region further includes a dielectric disposed between the adjacent semiconductor structures; a liner interposed between the dielectric and a sidewall of an abutting semiconductor structure; and a protective layer disposed over the liner and between a top surface of the dielectric and a top surface of a silicide layer on the semiconductor structure.

In some embodiments, a method of forming isolation regions includes depositing a protective layer over a semiconductor layer; patterning the protective layer to expose areas of the semiconductor layer; depositing an oxide on the exposed areas the semiconductor layer and between portions of the patterned protective layer; etching a portion of the patterned protective layer to expose the semiconductor layer; etching the exposed semiconductor layer to form isolation openings in the semiconductor layer; and filling the isolation openings with a dielectric to form the isolation regions.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   semiconductor structures formed over a substrate;
   a silicide layer formed on top surfaces of the semiconductor structures; and
   an isolation structure disposed between the semiconductor structures, wherein the isolation structure comprises:
      a first material in a middle portion of a top surface of the isolation structure;
      a second material at each edge portion of the top surface of the isolation structure, wherein the second material is different from the first material; and
      a third material surrounding the first material and in contact with a bottom surface of the second material, wherein the second material and a top surface of the first material are above the silicide layer.

2. The structure of claim 1, wherein the second material comprises silicon oxy-nitride, silicon nitride, silicon carbide, hafnium oxide, zirconium oxide, titanium oxide, or combinations thereof.

3. The structure of claim 1, wherein the second material is disposed between the first material and the silicide layer.

4. The structure of claim 1, wherein the first material comprises a dielectric material.

5. The structure of claim 1, wherein the second material has a thickness between about 5 nm and about 25 nm.

6. The structure of claim 1, wherein the silicide layer has a substantial uniform thickness across the semiconductor structures and is abutting the isolation structure.

7. A structure, comprising:
   semiconductor structures disposed over a substrate;
   a silicide layer disposed on each of the semiconductor structures;
   an isolation region between the semiconductor structures, the isolation region comprising:
      a dielectric disposed between the semiconductor structures;
      a liner interposed between the dielectric and sidewalls of the semiconductor structures; and
      a protective layer disposed on the liner and a sidewall portion of the dielectric, wherein sidewalls of the silicide layer abut sidewall portions of the liner.

8. The structure of claim 7, wherein the protective layer comprises silicon oxy-nitride, silicon nitride, silicon carbide, a metal oxide, or combinations thereof.

9. The structure of claim 8, wherein the metal oxide comprises hafnium oxide, zirconium oxide, titanium oxide, or combinations thereof.

10. The structure of claim 7, wherein the protective layer has a thickness between about 5 nm and about 25 nm.

11. The structure of claim 7, wherein the silicide layer has a substantial uniform thickness on the semiconductor structures.

12. A structure, comprising:
    a substrate;
    a pair of semiconductor structures spaced apart and formed on the substrate;
    an isolation structure formed between the pair of semiconductor structures, wherein the isolation structure comprises:
       a fill material partially surrounded by a liner material, wherein the liner material covers sidewall surfaces of each semiconductor structure in the pair of semiconductor structures and a top surface of the substrate; and
       a capping layer abutting a sidewall portion of the fill material and disposed on a top surface of the liner material; and
    a silicide layer on top surfaces of the pair of semiconductor structures.

13. The structure of claim 12, wherein top surfaces of the liner material and the fill material are not coplanar with the top surfaces of the pair of semiconductor structures.

14. The structure of claim 12, wherein a side surface of the silicide layer abuts a top portion of the liner material.

15. The structure of claim 12, wherein the silicide layer has a substantially uniform thickness across the top surfaces of the pair of semiconductor structures.

16. The structure of claim 12, wherein the capping layer has a thickness between about 5 nm and about 25 nm and comprises a metal oxide.

17. The structure of claim 12, wherein the capping layer comprises a silicon-based material comprising carbon, oxygen, nitrogen, or combinations thereof.

18. The structure of claim 12, wherein the top surfaces of the pair of semiconductor structures are divot-free in a region where the pair of semiconductor structures contacts the isolation structure.

19. The structure of claim 12, wherein top surfaces of the capping layer and the fill material are above a top surface of the silicide layer.

20. The structure of claim 12, wherein a top surface of the liner material and a top surface of the silicide layer are substantially coplanar.

* * * * *